(12) United States Patent
Ohto et al.

(10) Patent No.: US 9,196,472 B2
(45) Date of Patent: Nov. 24, 2015

(54) PROCESSING LIQUID FOR SUPPRESSING PATTERN COLLAPSE OF FINE METAL STRUCTURE, AND METHOD FOR PRODUCING FINE METAL STRUCTURE USING SAME

(75) Inventors: Masaru Ohto, Chiba (JP); Hiroshi Matsunaga, Tokyo (JP); Kenji Yamada, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 147 days.

(21) Appl. No.: 13/388,462

(22) PCT Filed: Jul. 21, 2010

(86) PCT No.: PCT/JP2010/062273
§ 371 (c)(1),
(2), (4) Date: Feb. 2, 2012

(87) PCT Pub. No.: WO2011/016337
PCT Pub. Date: Feb. 10, 2011

(65) Prior Publication Data
US 2012/0135604 A1 May 31, 2012

(30) Foreign Application Priority Data
Aug. 7, 2009 (JP) ................. 2009-185124

(51) Int. Cl.
*H01L 21/306* (2006.01)
*B81C 1/00* (2006.01)
*C07F 9/09* (2006.01)
*C09K 3/00* (2006.01)
*H01L 21/02* (2006.01)

(52) U.S. Cl.
CPC ...... *H01L 21/02057* (2013.01); *B81C 1/00928* (2013.01)

(58) Field of Classification Search
USPC ............. 438/694, 745; 252/382, 384, 389.23, 252/400.23; 510/175; 257/E21.215, 257/E21.224, E21.228; 558/183, 186, 208
See application file for complete search history.

(56) References Cited

U.S. PATENT DOCUMENTS 3,723,313 A * 3/1973 Churn ........................ 508/408
4,451,709 A * 5/1984 Waxman .................... 381/327

(Continued)

FOREIGN PATENT DOCUMENTS

| CN | 1439701 A | 9/2003 |
|----|-----------|--------|
| JP | 11 249323 | 9/1999 |
| JP | 2007 213013 | 8/2007 |

OTHER PUBLICATIONS

International Search Report Issued Nov. 2, 2010 in PCT/JP10/62273 Filed Jul. 21, 2010.

(Continued)

*Primary Examiner* — Joseph D Anthony
(74) *Attorney, Agent, or Firm* — Oblon, McClelland, Maier & Neustadt, L.L.P.

(57) ABSTRACT

There are provided a processing liquid that is capable of suppressing pattern collapse of a fine metal structure, such as a semiconductor device and a micromachine, and a method for producing a fine metal structure using the same. The processing liquid for suppressing pattern collapse of a fine metal structure, contains a phosphate ester and/or a polyoxyalkylene ether phosphate ester, and the method for producing a fine metal structure, uses the same.

16 Claims, 2 Drawing Sheets

(56) References Cited

U.S. PATENT DOCUMENTS

| | | | | |
|---|---|---|---|---|
| 4,460,692 A | * | 7/1984 | Tellier et al. | 435/248 |
| 5,232,742 A | * | 8/1993 | Chakravarti | 427/387 |
| 5,401,590 A | * | 3/1995 | Chalilpoyil et al. | 429/59 |
| 5,851,108 A | * | 12/1998 | Clymer et al. | 417/44.1 |
| 7,138,362 B2 | * | 11/2006 | Abe et al. | 510/175 |
| 2002/0011180 A1 | * | 1/2002 | Miyamoto et al. | 106/31.58 |
| 2003/0171233 A1 | * | 9/2003 | Abe et al. | 510/175 |
| 2004/0020134 A1 | * | 2/2004 | Kim et al. | 51/307 |
| 2004/0224866 A1 | * | 11/2004 | Matsunaga et al. | 510/175 |
| 2004/0226477 A1 | * | 11/2004 | Hoshi et al. | 106/31.86 |
| 2005/0112503 A1 | * | 5/2005 | Kanda et al. | 430/311 |
| 2005/0245663 A1 | | 11/2005 | Sugeta et al. | |
| 2006/0040838 A1 | * | 2/2006 | Shimada et al. | 510/175 |
| 2006/0211583 A1 | * | 9/2006 | Valencia Sil et al. | 508/215 |
| 2008/0026975 A1 | | 1/2008 | Koshiyama et al. | |
| 2009/0004608 A1 | | 1/2009 | Sawada et al. | |
| 2009/0081307 A1 | * | 3/2009 | Tsuda | 424/497 |
| 2010/0152085 A1 | * | 6/2010 | Shimada et al. | 510/175 |

OTHER PUBLICATIONS

Combined Chinese Office Action and Search Report issued Jan. 24, 2014 in Patent Application 201080035064.5 (with English translation of categories of cited documents).

* cited by examiner

Fig.1
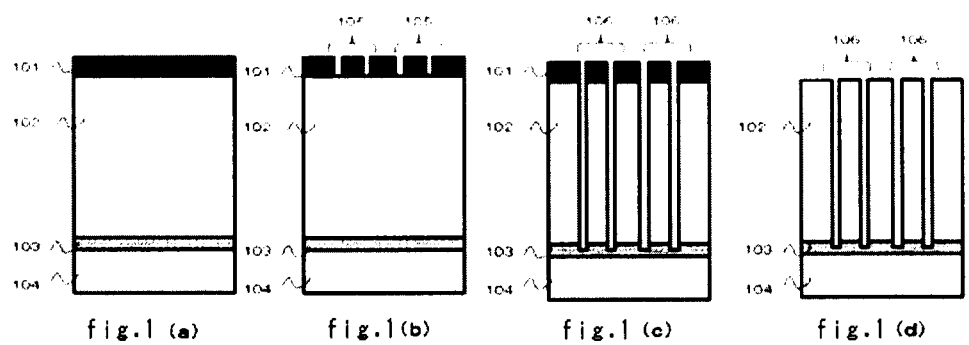
fig.1 (a)　　fig.1 (b)　　fig.1 (c)　　fig.1 (d)
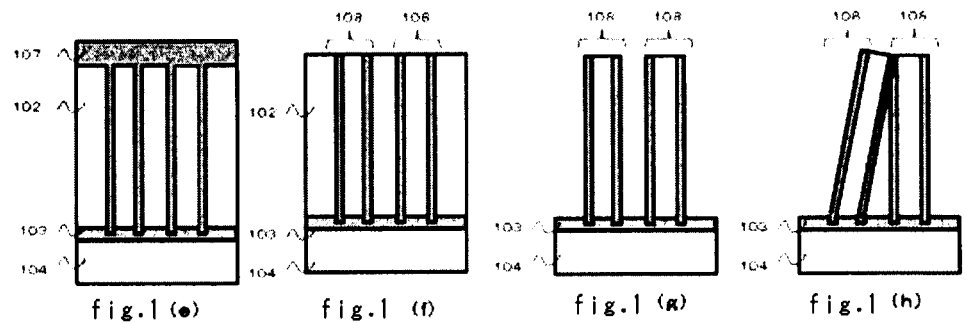
fig.1 (e)　　fig.1 (f)　　fig.1 (g)　　fig.1 (h)

PROCESSING LIQUID FOR SUPPRESSING PATTERN COLLAPSE OF FINE METAL STRUCTURE, AND METHOD FOR PRODUCING FINE METAL STRUCTURE USING SAME

This application is a 371 of PCT/JP2010/062273 filed Jul. 21, 2010 which claims foreign benefit to Japan 2009-185124 filed Aug. 7, 2009.

TECHNICAL FIELD

The present invention relates to a processing liquid for suppressing pattern collapse of a fine metal structure, and a method for producing a fine metal structure using the same.

BACKGROUND ART

The photolithography technique has been employed as a formation and processing method of a device having a fine structure used in a wide range of fields of art including a semiconductor device, a circuit board and the like. In these fields of art, reduction of size, increase of integration degree and increase of speed of a semiconductor device considerably proceed associated with the highly sophisticated demands on capabilities, which brings about continuous miniaturization and increase of aspect ratio of the resist pattern used for photolithography. However, the progress of miniaturization of a resist pattern causes pattern collapse as a major problem.

It has been known that upon drying a resist pattern from a processing liquid used in wet processing (which is mainly a rinsing treatment for washing away the developer solution) after developing the resist pattern, the collapse of the resist pattern is caused by the stress derived by the surface tension of the processing liquid. For preventing the collapse of the resist pattern, such methods have been proposed as a method of replacing the rinsing liquid by a liquid having a low surface tension using a nonionic surfactant, a compound soluble in an alcohol solvent, or the like (see, for example, Patent Documents 1 and 2), and a method of hydrophobizing the surface of the resist pattern (see, for example, Patent Document 3).

In a fine structure formed of a metal, a metal nitride, a metal oxide or the like (which may be hereinafter referred to as a fine metal structure, and a metal, a metal nitride and a metal oxide may be hereinafter referred totally as a metal) by the photolithography technique, the strength of the metal itself constituting the structure is larger than the strength of the resist pattern itself or the bonding strength between the resist pattern and the substrate, and therefore, the collapse of the structure pattern is hard to occur as compared to the resist pattern. However, associated with the progress of reduction of size, increase of integration degree and increase of speed of a semiconductor device and a micromachine, the pattern collapse of the structure is becoming a major problem due to miniaturization and increase of aspect ratio of the resist pattern. The fine metal structure has a surface state that is totally different from that of the resist pattern, which is an organic material, and therefore, unlike in the case of the collapse of the resist pattern there is no effective measure for preventing the pattern collapse of the structure. Accordingly, the current situation is that the degree of freedom on designing the pattern for producing a semiconductor device or a micromachine with reduced size, increased integration degree and increased speed is considerably impaired since the pattern is necessarily designed for preventing the pattern collapse.

Patent Document 1
  JP-A-2004-184648
Patent Document 2
  JP-A-2005-309260
Patent Document 3
  JP-A-2006-163314

BRIEF DESCRIPTION OF THE DRAWINGS

[FIG. 1] The figure includes schematic cross sectional views of each production step of fine metal structures produced in Examples 1 to 48 and Comparative Examples 1 to 30.

Figure 2:
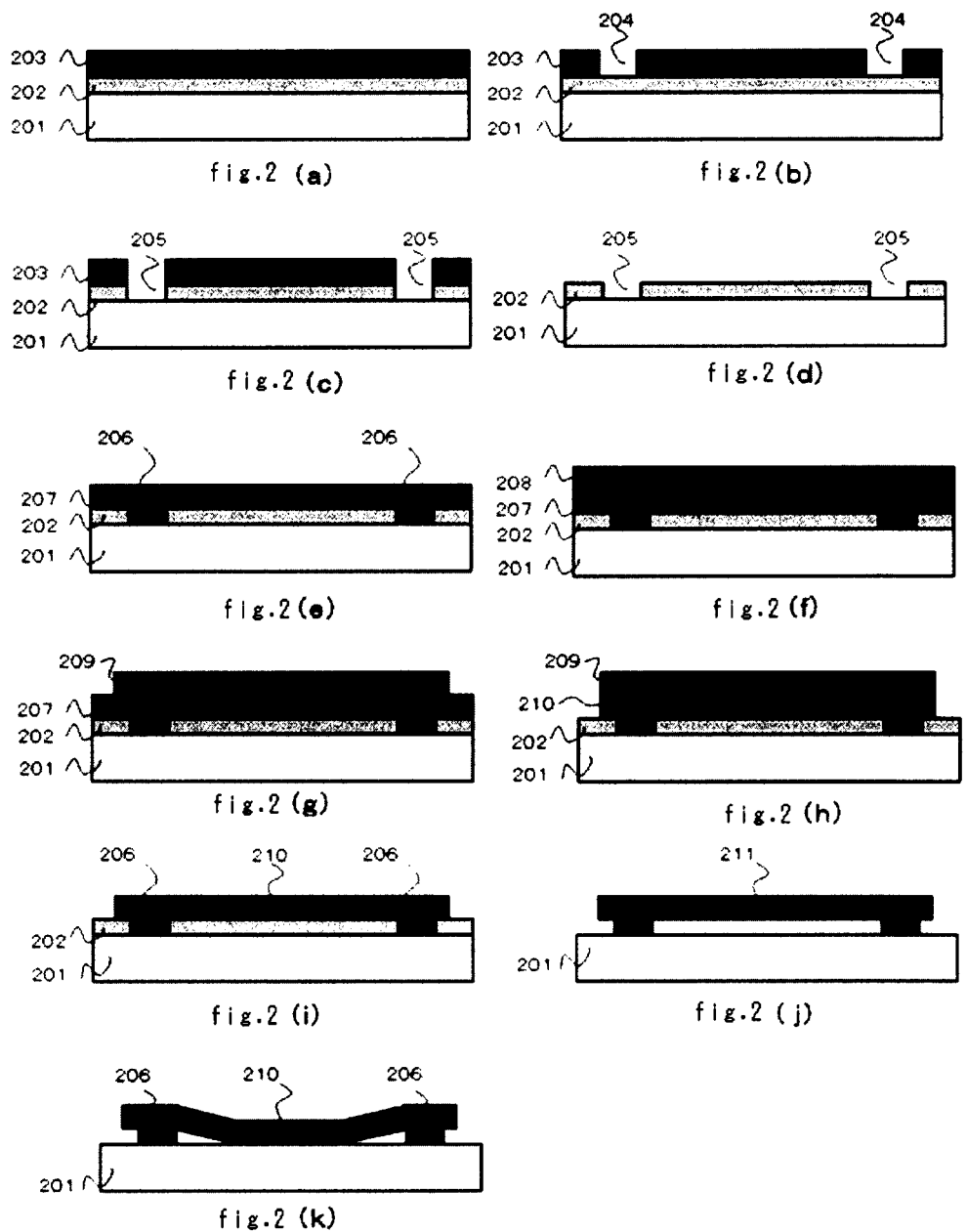
[FIG. 2] The figure includes schematic cross sectional views of each production step of fine metal structures produced in Examples 49 to 112 and Comparative Examples 31 to 70.

DESCRIPTION OF THE SYMBOLS 101 photoresist
102 silicon oxide
103 silicon nitride
104 silicon substrate
105 circular opening
106 cylindrical hole
107 metal (titanium nitride, tungsten or tantalum)
108 cylindrical hollow of metal (titanium nitride, tungsten or tantalum)
201 silicon oxide layer
202 polysilicon
203 photoresist
204 rectangular columnar opening
205 rectangular columnar hole 205
206 rectangular column of metal (titanium, aluminum oxide, hafnium oxide or ruthenium)
207 metal (titanium, aluminum oxide, hafnium oxide or ruthenium) layer
208 photoresist
209 rectangular photomask
210 metal (titanium, aluminum oxide, hafnium oxide or ruthenium) plate
211 bridge structure Disclosure of the Invention
Problems to be Solved by the Invention As described above, the current situation is that no effective technique for suppressing pattern collapse has been known in the field of a fine metal structure, such as a semiconductor device and a micromachine.

The present invention has been developed under the circumstances, and an object thereof is to provide a processing liquid that is capable of suppressing pattern collapse of a fine metal structure, such as a semiconductor device and a micromachine, and a method for producing a fine metal structure using the same.

Means for Solving the Problems

As a result of earnest investigations made by the inventors for achieving the object, it has been found that the object can be achieved with a processing liquid containing a phosphate ester and/or a polyoxyalkylene ether phosphate ester.

The present invention has been completed based on the finding. Accordingly, the gist of the present invention is as follows.

(1) A processing liquid for suppressing pattern collapse of a fine metal structure, containing a phosphate ester and/or a polyoxyalkylene ether phosphate ester.

(2) The processing liquid according to the item (1), wherein the phosphate ester and/or the polyoxyalkylene ether phosphate ester is represented by the following general formula (1) and/or the following general formula (2):

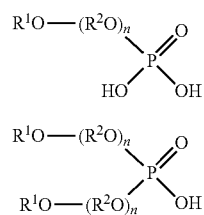

wherein $R^1$ represents an alkyl group having from 2 to 24 carbon atoms or an alkenyl group having from 2 to 24 carbon atoms; and $R^2$ represents an alkanediyl group or an alkenediyl group having from 2 to 6 carbon atoms, in which plural groups represented by $R^1$ or $R^2$ may be the same as or different from each other; and n represents a number of from 0 to 20, in which plural numbers represented by n may be the same as or different from each other.

(3) The processing liquid according to the item (1) or (2), which further contains water.

(4) The processing liquid according to any one of the items (1) to (3), wherein $OR^2$ in the general formulae (1) and (2) is an oxyethylene group and/or an oxypropylene group.

(5) The processing liquid according to any one of the items (1) to (4), wherein a content of the phosphate ester and/or the polyoxyalkylene ether phosphate ester is from 10 ppm to 50%.

(6) The processing liquid according to any one of the items (1) to (5), wherein the pattern of the fine metal structure contains at least one material selected from titanium nitride, titanium, ruthenium, ruthenium oxide, tungsten, tungsten silicide, tungsten nitride, aluminum oxide, hafnium oxide, hafnium silicate, hafnium nitride silicate, platinum, tantalum, tantalum oxide, tantalum nitride, nickel silicide, nickel silicon germanium and nickel germanium.

(7) A method for producing a fine metal structure, containing after wet etching or dry etching, a rinsing step using the processing liquid according to any one of the items (1) to (6).

(8) The production method according to the item (7), wherein the pattern of the fine metal structure contains at least one material selected from titanium nitride, titanium, ruthenium, ruthenium oxide, tungsten, tungsten silicide, tungsten nitride, aluminum oxide, hafnium oxide, hafnium silicate, hafnium nitride silicate, platinum, tantalum, tantalum oxide, tantalum nitride, nickel silicide, nickel silicon germanium and nickel germanium.

(9) The production method according to the item (7) or (8), wherein the fine metal structure is a semiconductor device or a micromachine.

Advantages of the Invention

According to the present invention, there are provided a processing liquid that is capable of suppressing pattern collapse of a fine metal structure, such as a semiconductor device and a micromachine, and a method for producing a fine metal structure using the same.

Best Mode For Carrying Out The Invention

Processing Liquid

The processing liquid of the present invention is used for suppressing pattern collapse of a fine metal structure, and contains a phosphate ester and/or a polyoxyalkylene ether phosphate ester.

Phosphate Ester and Polyoxyalkylene Ether Phosphate Ester

It is considered that the phosphate ester and the polyoxyalkylene ether phosphate ester used in the processing liquid of the present invention are adsorbed on the metal material used in the pattern of the fine metal structure, thereby hydrophobizing the surface of the pattern. The hydrophobization in the present invention means that the contact angle of the metal surface having been processed with the processing liquid of the present invention with respect to water is 70° or more. The phosphate ester and the polyoxyalkylene ether phosphate ester generally contain a monoester and a diester simultaneously, and a monoester or a diester may be used solely. Preferred examples of the phosphate ester and the polyoxyalkylene ether phosphate ester include compounds represented by the following general formula (1) and/or the following general formula (2):

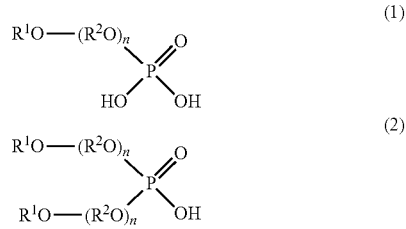

In the formulae, $R^1$ represents an alkyl group having from 2 to 24 carbon atoms or an alkenyl group having from 2 to 24 carbon atoms. The alkyl group is preferably an alkyl group having from 6 to 18 carbon atoms, more preferably an alkyl group having from 12 to 18 carbon atoms, further preferably an alkyl group having 12, 13 or 18 carbon atoms, and particularly preferably an alkyl group having 18 carbon atoms. The alkyl group may be linear, branched or cyclic, and may have a halogen atom or a substituent. Examples of the alkyl group include various kinds of hexyl groups, such as a n-hexyl group, a 1-methylhexyl group, a 2-methylhexyl group, a 1-pentylhexyl group, a cyclohexyl group, a 1-hydroxyhexyl group, a 1-chlorohexyl group, 1,3-dichlorohexyl group, a 1-aminohexyl group, a 1-cyanohexyl group and a 1-nitrohexyl group, and also include various kinds of heptyl groups, various kinds of octyl groups, various kinds of nonyl groups, various kinds of decyl groups, various kinds of undecyl groups, various kinds of dodecyl groups, various kinds of tridecyl groups, various kinds of tetradecyl groups, various kinds of pentadecyl groups, various kinds of hexadecyl groups, various kinds of heptadecyl groups, various kinds of octadecyl groups, various kinds of nonadecyl groups and various kinds of eicosyl groups. Preferred examples of the alkyl group include various kinds of hexyl groups, and also include various kinds of heptyl groups, various kinds of octyl groups, various kinds of nonyl groups, various kinds of decyl groups, various kinds of undecyl groups, various kinds of dodecyl groups, various kinds of tridecyl groups, various kinds of tetradecyl groups and various kinds of octadecyl groups, and more preferably various kinds of dodecyl groups, various kinds of tridecyl groups and various kinds of octadecyl groups. Plural groups represented by $R^1$ in the formula (2) may be the same as or different from each other.

The alkenyl group is preferably an alkenyl group having from 2 to 24 carbon atoms, more preferably an alkenyl group having from 4 to 18 carbon atoms, further preferably an alkenyl group having from 6 to 18 carbon atoms, and particularly preferably an oleyl group having 18 carbon atoms. The alkenyl group may be linear or branched.

In the formulae, $R^2$ represents an alkanediyl group or an alkenediyl group having from 2 to 6 carbon atoms, and plural groups represented by $R^2$ may be the same as or different from each other.

The alkanediyl group having from 2 to 6 carbon atoms may be linear or branched, and examples thereof include an ethylene group, a 1,2-propanediyl group, a 1,3-propanediyl group, various kinds of butanediyl groups, various kinds of pentanediyl groups and various kinds of hexanediyl groups. Preferred examples among these include linear groups, such as an ethylene group, a 1,3-propanediyl group, a 1,4-butanediyl group, 1,5-pentanediyl group and 1,6-hexanediyl group, and particularly preferred examples include an ethylene group and a 1,2-propanediyl group. Accordingly, particularly preferred examples of $OR^2$ include an oxyethylene group and an oxypropylene group.

In the formulae, n represents a number of from 0 to 20, and preferably from 0 to 14. When n is in the range, the phosphate ester and/or the polyoxyalkylene ether phosphate ester used in the present invention is in a liquid state and is easily soluble in a solvent, such as water or an organic solvent, to form the processing liquid favorably, while depending on the balance between hydrophilicity and hydrophobicity of the functional group represented by $R^1$ in the formulae.

In the present invention, the compound represented by the general formula (1) or (2) is preferably an alkyl phosphate ester or a polyoxyalkylene alkyl ether phosphate ester, in which $R^1$ and $R^3$ each are an alkyl group, and $R^2$ is an alkanediyl group, an alkenyl phosphate ester or a polyoxyalkylene alkenyl ether phosphate ester, in which $R^1$ is an alkenyl group, and $R^2$ is an alkanediyl group or the like. Two groups represented by $R^1$ in the general formula (2) may be the same as or different from each other. The use of the aforementioned compounds makes the processing liquid of the present invention exhibit the excellent function of suppressing pattern collapse.

Particularly preferred examples of the compounds represented by the general formulae (1) and (2) include an alkyl phosphate ester, such as an octyl phosphate ester, a lauryl phosphate ester, a tridecyl phosphate ester and a compound represented by the general formula (2), in which n is 0, and $R^1$ is a mixture of groups having from 6 to 10 carbon atoms (from hexyl to decyl); a polyoxyethylene alkyl ether phosphate ester, such as a polyoxyethylene hexyl ether phosphate ester (n: 1 to 8), a polyoxyethylene heptyl ether phosphate ester (n: 1 to 8), a polyoxyethylene octyl ether phosphate ester (n: 1 to 8), a polyoxyethylene nonenyl ether phosphate ester (n: 1 to 8), a polyoxyethylene decyl ether phosphate ester (n: 1 to 12), a polyoxyethylene lauryl ether phosphate ester (n: 1 to 12), a polyoxyethylene tridecyl ether phosphate ester (n: 1 to 12) and a polyoxyethylene stearyl ether phosphate ester (n: 1 to 12); a polyoxyethylene alkenyl ether phosphate ester, such as polyoxyethylene oleyl ether phosphate ester (n: 1 to 12); a polyoxyethylene polyoxypropylene alkyl ether phosphate ester, such as a polyoxyethylene polyoxypropylene nonenyl ether phosphate ester (n: 1 to 8), a polyoxyethylene polyoxypropylene decyl ether phosphate ester (n: 1 to 10), a polyoxyethylene polyoxypropylene undecyl ether phosphate ester (n: 1 to 8), a polyoxyethylene polyoxypropylene dodecyl ether phosphate ester (n: 1 to 8), a polyoxyethylene polyoxypropylene tridecyl ether phosphate ester (n: 1 to 8) and a polyoxyethylene polyoxypropylene tetradecyl ether phosphate ester (n: 1 to 8); and mixtures of these compounds.

Water

The processing liquid of the present invention preferably further contains water and is preferably an aqueous solution. Preferred examples of the water include water, from which metallic ions, organic impurities, particles and the like are removed by distillation, ion exchange, filtering, adsorption treatment or the like, and particularly preferred examples thereof include pure water and ultrapure water.

Processing Liquid

The processing liquid of the present invention contains the phosphate ester and the polyoxyalkylene ether phosphate ester described above, preferably contains water, and may contain various kinds of additives that are ordinarily used in processing liquids in such a range that does not impair the advantages of the processing liquid.

The content of the phosphate ester and the polyoxyalkylene ether phosphate ester in the processing liquid of the present invention is preferably from 10 ppm to 50%. When the content of the phosphate ester and the polyoxyalkylene ether phosphate ester is in the range, the advantages of the compounds may be sufficiently obtained. In consideration of handleability, economy and foaming, the compounds are used preferably at a lower concentration of 10% or less, more preferably from 10 to 2,000 ppm, and further preferably from 10 to 1,000 ppm.

In the case where the compounds do not have sufficient solubility in water to cause phase separation, an organic solvent, such as an alcohol, may be added, and an acid or an alkali may be added to enhance the solubility. Even in the case where the processing liquid is simply turbid white without phase separation, the processing liquid may be used in such a range that does not impair the advantages of the processing liquid, and may be used while stirring to make the processing liquid homogeneous. Furthermore, for avoiding the white turbidity of the processing liquid, the processing liquid may be used after adding an organic solvent, such as an alcohol, an acid or an alkali thereto as similar to the above case.

The processing liquid of the present invention may be used favorably for suppressing pattern collapse of a fine metal structure, such as a semiconductor device and a micromachine. Preferred examples of the pattern of the fine metal structure include ones containing at least one material selected from TiN (titanium nitride), Ti (titanium), Ru (ruthenium), RuO (ruthenium oxide), $SrRuO_3$ (SRO), W (tungsten), WSi (tungsten silicide), WN (tungsten nitride), $Al_2O_3$ (aluminum oxide), $HfO_2$ (hafnium oxide), $HfSiO_x$ (hafnium silicate), HfSiON (hafnium nitride silicate), Pt (platinum), Ta (tantalum), $Ta_2O_5$ (tantalum oxide), TaN (tantalum nitride), NiSi (nickel silicide), NiSiGe (nickel silicon germanium) and NiGe (nickel germanium), more preferred examples thereof include TiN (titanium nitride), Ti (titanium), Ru (ruthenium), RuO (ruthenium oxide), $SrRuO_3$ (SRO), W (tungsten), WSi (tungsten silicide), $Al_2O_3$ (aluminum oxide), $HfO_2$ (hafnium oxide), Pt (platinum), Ta (tantalum), $Ta_2O_5$ (tantalum oxide) and TaN (tantalum nitride), and further preferred examples thereof include TiN (titanium nitride), W (tungsten), Ta (tantalum), Ti (titanium), $Al_2O_3$ (aluminum oxide), $HfO_2$ (hafnium oxide) and Ru (ruthenium).

The fine metal structure may be patterned on an insulating film species, such as $SiO_2$ (a silicon oxide film) and TEOS (a tetraethoxy ortho silane oxide film), in some cases, or the insulating film species is contained as a part of the fine metal structure in some cases.

The processing liquid of the present invention exhibits excellent pattern collapse suppressing effect to not only an ordinary fine metal structure, but also a fine metal structure with further miniaturization and higher aspect ratio. The aspect ratio referred herein is a value calculated from (height of pattern/width of pattern), and the processing liquid of the present invention has excellent pattern collapse suppressing effect to a pattern that has a high aspect ratio of 3 or more, and further 7 or more. The processing liquid of the present invention has excellent pattern collapse suppressing effect to a fine pattern with a pattern size of 300 nm or less, further 150 nm or less, and still further 100 nm or less, and with a pattern size of 50 nm or less and a line/space ratio of 1/1, and similarly to a fine pattern with a pattern distance of 300 nm or less, further 150 nm or less, still further 100 nm or less, and still further 50 nm or less and a cylindrical hollow or cylindrical solid structure.

Method for producing Fine Metal Structure

The method for producing a fine metal structure of the present invention contains, after wet etching or dry etching, a rinsing step using the processing liquid of the present invention. More specifically, in the rinsing step, it is preferred that the pattern of the fine metal structure is made in contact with the processing liquid of the present invention by dipping, spray ejecting, spraying or the like, then the processing liquid is replaced by water, and the fine metal structure is dried. In the case where the pattern of the fine metal structure and the processing liquid of the present invention are in contact with each other by dipping, the dipping time is preferably from 10 seconds to 30 minutes, more preferably from 15 seconds to 20 minutes, further preferably from 20 seconds to 15 minutes, and particularly preferably from 30 seconds to 10 minutes, and the temperature condition is preferably from 10 to 60° C., more preferably from 15 to 50° C., further preferably from 20 to 40° C., and particularly preferably from 25 to 40° C. The pattern of the fine metal structure may be rinsed with water before making in contact with the processing liquid of the present invention. The contact between the pattern of the fine metal structure and the processing liquid of the present invention enables suppression of collapse of the pattern through hydrophobization of the surface of the pattern.

The processing liquid of the present invention may be applied widely to a production process of a fine metal structure irrespective of the kind of the fine metal structure, as far as the production process has a step of wet etching or dry etching, then a step of wet processing (such as etching, cleaning or rinsing for washing the cleaning liquid), and then a drying step. For example, the processing liquid of the present invention may be favorably used after the etching step in the production process of a semiconductor device or a micromachine, for example, (i) after wet etching of an insulating film around an electroconductive film in the production of a DRAM type semiconductor device (see, for example, JP-A-2000-196038 and JP-A-2004-288710), (ii) after a rinsing step for removing contamination formed after dry etching or wet etching upon processing a gate electrode in the production of a semiconductor device having a transistor with a fin in the form of strips (see, for example, JP-A-2007-335892), and (iii) after a rinsing step for removing contamination formed upon etching for forming a cavity by removing sacrifice layer formed of an insulating film through a through hole in an electroconductive film upon forming a cavity of a micromachine (electrodynamic micromachine) (see, for example, JP-A-2009-122031).

EXAMPLE

The present invention will be described in more detail with reference to examples and comparative examples below, but the present invention is not limited to the examples.

Preparation of Processing Liquid

Processing liquids for suppressing pattern collapse of a fine metal structure of Examples 1 and 2 were prepared according the formulation compositions (% by mass) shown in Table 1.

TABLE 1

| | Phosphate ester | | | Polyoxyalkylene ether phosphate ester | | | |
|---|---|---|---|---|---|---|---|
| | Kind | Number of carbon atoms of alkyl group or the like [1] | Content | Kind | Number of carbon atoms of alkyl group or the like [1] | Content | Water |
| Processing liquid 1 | — | — | — | A [2] | 6-10 | 50% | balance |
| Processing liquid 2 | — | — | — | B [3] | 8 | 100 ppm | balance |
| Processing liquid 3 | — | — | — | C [4] | 9-10 | 500 ppm | balance |
| Processing liquid 4 | — | — | — | D [5] | 12 | 100 ppm | balance |
| Processing liquid 5 | — | — | — | E [6] | 12 | 1,000 ppm | balance |
| Processing liquid 6 | — | — | — | F [7] | 12 | 5,000 ppm | balance |
| Processing liquid 7 | — | — | — | G [8] | 13 | 100 ppm | balance |
| Processing liquid 8 | — | — | — | H [9] | 13 | 1,000 ppm | balance |
| Processing liquid 9 | — | — | — | I [10] | 13 | 10% | balance |
| Processing liquid 10 | — | — | — | J [11] | 18 | 10 ppm | balance |
| Processing liquid 11 | — | — | — | K [12] | 18 | 200 ppm | balance |
| Processing liquid 12 | — | — | — | L [13] | 10 | 200 ppm | balance |
| Processing liquid 13 | — | — | — | M [14] | 10 | 200 ppm | balance |
| Processing liquid 14 | — | — | — | N [15] | 8 | 100 ppm | balance |
| Processing liquid 15 | O [16] | 12 | 100 ppm | — | — | — | balance |
| Processing liquid 16 | P [17] | 13 | 50 ppm | — | — | — | balance |

[1] number of carbon atoms of the functional group $R^1$ in the general formulae (1) and (2) representing the phosphate ester and the polyoxyalkylene ether phosphate ester
[2] "RA-600", a trade name, produced by Toho Chemical Industry Co., Ltd., a mixture of polyoxyethylene alkyl ether phosphate esters (number of carbon atoms of alkyl group: 6 to 10), in the general formulae (1) and (2), n = 4
[3] "ED-200", a trade name, produced by Toho Chemical Industry Co., Ltd., a polyoxyethylene octyl ether phosphate ester, in the general formulae (1) and (2), n = 1
[4] a mixture of polyoxyethylene polyoxypropylene alkyl ether phosphate esters (number of carbon atoms of alkyl group: 9 to 11), in the general formulae (1) and (2), n = 5 and 6
[5] "ML-220", a trade name, produced by Toho Chemical Industry Co., Ltd., a polyoxyethylene lauryl ether phosphate ester, in the general formulae (1) and (2), n = 2
[6] "RD-510Y", a trade name, produced by Toho Chemical Industry Co., Ltd., a polyoxyethylene lauryl ether phosphate ester, in the general formulae (1) and (2), n = 4
[7] "ML-240", a trade name, produced by Toho Chemical Industry Co., Ltd., a polyoxyethylene lauryl ether phosphate ester, in the general formulae (1) and (2), n = 4
[8] "RS-410", a trade name, produced by Toho Chemical Industry Co., Ltd., a polyoxyethylene tridecyl ether phosphate ester, in the general formulae (1) and (2), n = 3

TABLE 1-continued

| | Phosphate ester | | | Polyoxyalkylene ether phosphate ester | | | |
|---|---|---|---|---|---|---|---|
| Kind | Number of carbon atoms of alkyl group or the like *[1] | Content | Kind | Number of carbon atoms of alkyl group or the like *[1] | Content | Water |

*[9] "RS-610", a trade name, produced by Toho Chemical Industry Co., Ltd., a polyoxyethylene tridecyl ether phosphate ester, in the general formulae (1) and (2), n = 6
*[10] "RS-710", a trade name, produced by Toho Chemical Industry Co., Ltd., a polyoxyethylene tridecyl ether phosphate ester, in the general formulae (1) and (2), n = 10
*[11] "RB-410", a trade name, produced by Toho Chemical Industry Co., Ltd., a polyoxyethylene stearyl ether phosphate ester, in the general formulae (1) and (2), n = 4
*[12] a polyoxyethylene oleyl ether phosphate ester, in the general formulae (1) and (2), n = 7
*[13] a polyoxyethylene polyoxypropylene alkyl ether phosphate ester (number of carbon atoms of alkyl group: 10), in the general formulae (1) and (2), n = 10 and 2
*[14] a polyoxyethylene alkyl ether phosphate ester (number of carbon atoms of alkyl group: 10), in the general formulae (1) and (2), n = 10
*[15] a polyoxyethylene octyl ether phosphate ester, in the general formulae (1) and (2), n = 3
*[16] "ML-200", a trade name, produced by Toho Chemical Industry Co., Ltd., a lauryl phosphate ester, in the general formulae (1) and (2), n = 0
*[17] "GF-185", a trade name, produced by Toho Chemical Industry Co., Ltd., a tridecyl phosphate ester, in the general formulae (1) and (2), n = 0

Examples 1 to 16

As shown in FIG. 1(a), silicon nitride 103 (thickness: 100 nm) and silicon oxide 102 (thickness: 1,200 nm) were formed as films on a silicon substrate 104, then a photoresist 101 was formed, and the photoresist 101 was exposed and developed, thereby forming a circular and ring-shaped opening 105 (diameter: 125 nm, distance between circles: 50 nm), as shown in FIG. 1(b). The silicon oxide 102 was etched by dry etching with the photoresist 101 as a mask, thereby forming a cylindrical hole 106 reaching the layer of silicon nitride 103, as shown in FIG. 1(c). The photoresist 101 was then removed by ashing, thereby providing a structure having the silicon oxide 102 with the cylindrical hole 106 reaching the layer of silicon nitride 103, as shown in FIG. 1(d). The cylindrical hole 106 of the resulting structure was filled with titanium nitride as a metal 107 (FIG. 1(e)), and an excessive portion of the metal (titanium nitride) 107 on the silicon oxide 102 was removed by chemical mechanical polishing (CMP), thereby providing a structure having the silicon oxide 102 with a cylindrical hollow of the metal (titanium nitride) 108 embedded therein, as shown in FIG. 1(f). The silicon oxide 102 of the resulting structure was removed by dissolving with hydrofluoric acid, and then the structure was processed by making into contact with pure water, the processing liquids 1 to 16, and pure water in this order, followed by drying, thereby providing a structure shown in FIG. 1(g).

The resulting structure had a fine structure with a chimney pattern containing cylindrical hollows of the metal (titanium nitride) (diameter: 125 nm, height: 1,200 nm (aspect ratio: 9.6), distance between the cylindrical hollows: 50 nm), and 70% or more of the pattern was not collapsed.

The pattern collapse was observed with "FE-SEM S-5500 (model number)", produced by Hitachi High-Technologies Corporation, and the collapse suppression ratio was a value obtained by calculating the ratio of the pattern not collapsed in the total pattern. Cases where the collapse suppression ratio was 50% or more were determined as passed. The compositions of the processing liquids 1 to 16 used in the examples are shown in Table 1, and the processing liquids, the processing methods and the results of collapse suppression ratios in the examples are shown in Table 3.

Comparative Example 1

A structure shown in FIG. 1(g) was obtained in the same manner as in Example 1 except that after removing the silicon oxide 102 of the structure shown in FIG. 1(f) by dissolving with hydrofluoric acid, the structure was processed only with pure water. 50% or more of the pattern of the resulting structure was collapsed as shown in FIG. 1(h) (which indicated a collapse suppression ratio of less than 50%. The processing liquid, the processing method and the result of collapse suppression ratio in Comparative Example 1 are shown in Table 3.

Comparative Examples 2 to 10

Structures shown in FIG. 1(g) of Comparative Examples 2 to 10 were obtained in the same manner as in Example 1 except that after removing the silicon oxide 102 of the structure shown in FIG. 1(f) by dissolving with hydrofluoric acid and being processed with pure water, the structures were processed with the comparative liquids 1 to 9 shown in Table 2 instead of the processing liquid 1. 50% or more of the pattern of the resulting structures was collapsed as shown in FIG. 1(h). The compositions of the comparative liquids 1 to 9 used in Comparative Examples 2 to 10 are shown in Table 2, and the comparative liquids, the processing methods and the results of collapse suppression ratios in the comparative examples are shown in Table 3.

TABLE 2

| | Name of substance |
|---|---|
| Comparative liquid 1 | isopropyl alcohol |
| Comparative liquid 2 | diethylene glycol monomethyl ether |
| Comparative liquid 3 | dimethylacetamide |
| Comparative liquid 4 | ammonium perfluoroalkylsulfonate*[1] |
| Comparative liquid 5 | perfluoroalkylcarbonate salt*[2] |
| Comparative liquid 6 | ethylene oxide adduct of 2,4,7,9-tetramethyl-5-decine-4,7-diol*[3] |
| Comparative liquid 7 | 2,4,7,9-tetramethyl-5-decine-4,7-diol*[4] |
| Comparative liquid 8 | laurylmethylammonium chloride*[5] |
| Comparative liquid 9 | polyoxyethylene polyoxypropylene block polymer*[6] |

*[1] "Fluorad FC-93", a trade name, produced by 3M Corporation, 0.01% aqueous solution
*[2] "Surfron S-111", a trade name, produced by AGC Seimi Chemical Co., Ltd., 0.01% aqueous solution
*[3] "Surfynol 420", a trade name, produced by Nisshin Chemical Industry Co., Ltd., 0.01% aqueous solution
*[4] "Surfynol 104", a trade name, produced by Nisshin Chemical Industry Co., Ltd., 0.01% aqueous solution
*[5] "Catiogen TML", a trade name produced by Dai-ichi Kogyo Seiyaku Co., Ltd., 0.01% aqueous solution
*[6] "Epan 420", a trade name produced by Dai-ichi Kogyo Seiyaku Co., Ltd., 0.01% aqueous solution

TABLE 3

|  | Processing method | Collapse suppression ratio*[1] | Pass or fail |
|---|---|---|---|
| Example 1 | pure water -> processing liquid 1 -> pure water -> drying | 70% or more | pass |
| Example 2 | pure water -> processing liquid 2 -> pure water -> drying | 90% or more | pass |
| Example 3 | pure water -> processing liquid 3 -> pure water -> drying | 70% or more | pass |
| Example 4 | pure water -> processing liquid 4 -> pure water -> drying | 80% or more | pass |
| Example 5 | pure water -> processing liquid 5 -> pure water -> drying | 80% or more | pass |
| Example 6 | pure water -> processing liquid 6 -> pure water -> drying | 80% or more | pass |
| Example 7 | pure water -> processing liquid 7 -> pure water -> drying | 80% or more | pass |
| Example 8 | pure water -> processing liquid 8 -> pure water -> drying | 80% or more | pass |
| Example 9 | pure water -> processing liquid 9 -> pure water -> drying | 80% or more | pass |
| Example 10 | pure water -> processing liquid 10 -> pure water -> drying | 90% or more | pass |
| Example 11 | pure water -> processing liquid 11 -> pure water -> drying | 90% or more | pass |
| Example 12 | pure water -> processing liquid 12 -> pure water -> drying | 80% or more | pass |
| Example 13 | pure water -> processing liquid 13 -> pure water -> drying | 80% or more | pass |
| Example 14 | pure water -> processing liquid 14 -> pure water -> drying | 70% or more | pass |
| Example 15 | pure water -> processing liquid 15 -> pure water -> drying | 70% or more | pass |
| Example 16 | pure water -> processing liquid 16 -> pure water -> drying | 70% or more | pass |
| Comparative Example 1 | pure water -> drying | less than 50% | fail |
| Comparative Example 2 | pure water -> comparative liquid 1 -> pure water -> drying | less than 50% | fail |
| Comparative Example 3 | pure water -> comparative liquid 2 -> pure water -> drying | less than 50% | fail |
| Comparative Example 4 | pure water -> comparative liquid 3 -> pure water -> drying | less than 50% | fail |
| Comparative Example 5 | pure water -> comparative liquid 4 -> pure water -> drying | less than 50% | fail |
| Comparative Example 6 | pure water -> comparative liquid 5 -> pure water -> drying | less than 50% | fail |
| Comparative Example 7 | pure water -> comparative liquid 6 -> pure water -> drying | less than 50% | fail |
| Comparative Example 8 | pure water -> comparative liquid 7 -> pure water -> drying | less than 50% | fail |
| Comparative Example 9 | pure water -> comparative liquid 8 -> pure water -> drying | less than 50% | fail |
| Comparative Example 10 | pure water -> comparative liquid 9 -> pure water -> drying | less than 50% | fail |

*[1]collapse suppression ratio = ((number of cylindrical hollows not collapsed)/(total number of cylindrical hollows)) × 100 (%)

Examples 17 to 32

Structures shown in FIG. 1(g) of Examples 17 to 32 were obtained in the same manner as in Examples 1 to 16 except that tungsten was used as the metal 107 instead of titanium nitride. The resulting structures had a fine structure with a pattern containing cylindrical hollows 108 of the metal (tungsten) (diameter: 125 nm, height: 1,200 nm (aspect ratio: 9.6), distance between the cylindrical hollows: 50 nm), and 70% or more of the pattern was not collapsed. The compositions of the processing liquids 1 to 16 used in the examples are shown in Table 1, and the processing liquids, the processing methods and the results of collapse suppression ratios in the examples are shown in Table 4.

Comparative Examples 11 to 20

Structures shown in FIG. 1(g) of Comparative Examples 11 to 20 were obtained in the same manner as in Comparative Examples 1 to 10 except that tungsten was used as the metal 107 instead of titanium nitride. 50% or more of the pattern of the resulting structures was collapsed as shown in FIG. 1(h). The compositions of the comparative liquids 1 to 9 used in the comparative examples are shown in Table 2, and the comparative liquids, the processing methods and the results of collapse suppression ratios in the comparative examples are shown in Table 4.

TABLE 4

|  | Processing method | Collapse suppression ratio*[1] | Pass or fail |
|---|---|---|---|
| Example 17 | pure water -> processing liquid 1 -> pure water -> drying | 70% or more | pass |
| Example 18 | pure water -> processing liquid 2 -> pure water -> drying | 90% or more | pass |
| Example 19 | pure water -> processing liquid 3 -> pure water -> drying | 70% or more | pass |
| Example 20 | pure water -> processing liquid 4 -> pure water -> drying | 80% or more | pass |
| Example 21 | pure water -> processing liquid 5 -> pure water -> drying | 80% or more | pass |
| Example 22 | pure water -> processing liquid 6 -> pure water -> drying | 80% or more | pass |
| Example 23 | pure water -> processing liquid 7 -> pure water -> drying | 80% or more | pass |
| Example 24 | pure water -> processing liquid 8 -> pure water -> drying | 80% or more | pass |
| Example 25 | pure water -> processing liquid 9 -> pure water -> drying | 80% or more | pass |
| Example 26 | pure water -> processing liquid 10 -> pure water -> drying | 90% or more | pass |
| Example 27 | pure water -> processing liquid 11 -> pure water -> drying | 90% or more | pass |
| Example 28 | pure water -> processing liquid 12 -> pure water -> drying | 80% or more | pass |
| Example 29 | pure water -> processing liquid 13 -> pure water -> drying | 80% or more | pass |
| Example 30 | pure water -> processing liquid 14 -> pure water -> drying | 70% or more | pass |
| Example 31 | pure water -> processing liquid 15 -> pure water -> drying | 70% or more | pass |
| Example 32 | pure water -> processing liquid 16 -> pure water -> drying | 70% or more | pass |
| Comparative Example 11 | pure water -> drying | less than 50% | fail |
| Comparative Example 12 | pure water -> comparative liquid 1 -> pure water -> drying | less than 50% | fail |
| Comparative Example 13 | pure water -> comparative liquid 2 -> pure water -> drying | less than 50% | fail |
| Comparative Example 14 | pure water -> comparative liquid 3 -> pure water -> drying | less than 50% | fail |
| Comparative Example 15 | pure water -> comparative liquid 4 -> pure water -> drying | less than 50% | fail |
| Comparative Example 16 | pure water -> comparative liquid 5 -> pure water -> drying | less than 50% | fail |
| Comparative Example 17 | pure water -> comparative liquid 6 -> pure water -> drying | less than 50% | fail |

TABLE 4-continued

| | Processing method | Collapse suppression ratio*[1] | Pass or fail |
|---|---|---|---|
| Comparative Example 18 | pure water -> comparative liquid 7 -> pure water -> drying | less than 50% | fail |
| Comparative Example 19 | pure water -> comparative liquid 8 -> pure water -> drying | less than 50% | fail |
| Comparative Example 20 | pure water -> comparative liquid 9 -> pure water -> drying | less than 50% | fail |

*[1]collapse suppression ratio = ((number of cylindrical hollows not collapsed)/(total number of cylindrical hollows)) × 100 (%)

Examples 33 to 48

Structures shown in FIG. 1(g) of Examples 33 to 48 were obtained in the same manner as in Examples 1 to 16 except that tantalum was used as the metal 107 instead of titanium nitride. The resulting structures had a fine structure with a pattern containing cylindrical hollows 108 of the metal (tantalum) (diameter: 125 nm, height: 1,200 nm (aspect ratio: 9.6), distance between the cylindrical hollows: 50 nm), and 70% or more of the pattern was not collapsed. The compositions of the processing liquids 1 to 16 used in the examples are shown in Table 1, and the processing liquids, the processing methods and the results of collapse suppression ratios in the examples are shown in Table 5.

Comparative Examples 21 to 30

Structures shown in FIG. 1(g) of Comparative Examples 21 to 30 were obtained in the same manner as in Comparative Examples 1 to 10 except that tantalum was used as the metal 107 instead of titanium nitride. 50% or more of the pattern of the resulting structures was collapsed as shown in FIG. 1(h). The compositions of the comparative liquids 1 to 9 used in the comparative examples are shown in Table 2, and the comparative liquids, the processing methods and the results of collapse suppression ratios in the comparative examples are shown in Table 5.

Examples 49 to 64

As shown in FIG. 2(a), polysilicon 202 (thickness: 100 nm) was formed on a silicon oxide layer 201 formed on a silicon substrate, and after forming a photoresist 203 thereon, the photoresist 203 was exposed and developed, thereby forming a rectangular columnar opening 204 (1,000 nm×8,000 nm) as shown in FIG. 2(b) was formed. The polysilicon 202 was dry etched with the photoresist 203 as a mask, thereby forming a rectangular columnar hole 205 therein reaching the silicon oxide layer 201 as shown in FIG. 2(c). The photoresist 203 was then removed by ashing, thereby providing a structure having the polysilicon 202 with the rectangular columnar hole 205 therein reaching the silicon oxide layer 201 as shown in FIG. 2(d). The rectangular columnar hole 205 of the resulting structure was filled with titanium, thereby forming a rectangular column of a metal (titanium) 206 and a metal (titanium) layer 207 (FIG. 2(e)), and a photoresist 208 was formed on the metal (titanium) layer 207 (FIG. 2(f)). The photoresist 208 was exposed and developed, thereby forming a photomask 209 having a rectangular shape covering the area including the two rectangular columns of a metal (titanium) 206 as shown in FIG. 2(g), and the metal (titanium) layer 207 was dry etched with the rectangular photomask 209 as a mask, thereby forming a metal (titanium) plate 210 having the rectangular columns of a metal (titanium) 206 at both the ends

TABLE 5

| | Processing method | Collapse suppression ratio*[1] | Pass or fail |
|---|---|---|---|
| Example 33 | pure water -> processing liquid 1 -> pure water -> drying | 70% or more | pass |
| Example 34 | pure water -> processing liquid 2 -> pure water -> drying | 90% or more | pass |
| Example 35 | pure water -> processing liquid 3 -> pure water -> drying | 70% or more | pass |
| Example 36 | pure water -> processing liquid 4 -> pure water -> drying | 80% or more | pass |
| Example 37 | pure water -> processing liquid 5 -> pure water -> drying | 80% or more | pass |
| Example 38 | pure water -> processing liquid 6 -> pure water -> drying | 80% or more | pass |
| Example 39 | pure water -> processing liquid 7 -> pure water -> drying | 80% or more | pass |
| Example 40 | pure water -> processing liquid 8 -> pure water -> drying | 80% or more | pass |
| Example 41 | pure water -> processing liquid 9 -> pure water -> drying | 80% or more | pass |
| Example 42 | pure water -> processing liquid 10 -> pure water -> drying | 90% or more | pass |
| Example 43 | pure water -> processing liquid 11 -> pure water -> drying | 90% or more | pass |
| Example 44 | pure water -> processing liquid 12 -> pure water -> drying | 80% or more | pass |
| Example 45 | pure water -> processing liquid 13 -> pure water -> drying | 80% or more | pass |
| Example 46 | pure water -> processing liquid 14 -> pure water -> drying | 70% or more | pass |
| Example 47 | pure water -> processing liquid 15 -> pure water -> drying | 70% or more | pass |
| Example 48 | pure water -> processing liquid 16 -> pure water -> drying | 70% or more | pass |
| Comparative Example 21 | pure water -> drying | less than 50% | fail |
| Comparative Example 22 | pure water -> comparative liquid 1 -> pure water -> drying | less than 50% | fail |
| Comparative Example 23 | pure water -> comparative liquid 2 -> pure water -> drying | less than 50% | fail |
| Comparative Example 24 | pure water -> comparative liquid 3 -> pure water -> drying | less than 50% | fail |
| Comparative Example 25 | pure water -> comparative liquid 4 -> pure water -> drying | less than 50% | fail |
| Comparative Example 26 | pure water -> comparative liquid 5 -> pure water -> drying | less than 50% | fail |
| Comparative Example 27 | pure water -> comparative liquid 6 -> pure water -> drying | less than 50% | fail |
| Comparative Example 28 | pure water -> comparative liquid 7 -> pure water -> drying | less than 50% | fail |
| Comparative Example 29 | pure water -> comparative liquid 8 -> pure water -> drying | less than 50% | fail |
| Comparative Example 30 | pure water -> comparative liquid 9 -> pure water -> drying | less than 50% | fail |

*[1]collapse suppression ratio = ((number of cylindrical hollows not collapsed)/(total number of cylindrical hollows)) × 100 (%)

of the lower part thereof as shown in FIG. 2(h). The rectangular photomask 209 was then removed by ashing, thereby providing a structure having the polysilicon 202 and the metal (titanium) plate 210 having the rectangular columns of a metal (titanium) 206 as shown in FIG. 2(i). The polysilicon 202 of the resulting structure was removed by dissolving with a tetramethylammonium hydroxide aqueous solution, and then the structure was processed by making into contact with pure water, the processing liquids 1 to 16, and pure water in this order, followed by drying, thereby providing a bridge structure 211 shown in FIG. 2(j) of Examples 49 to 64.

The resulting bridge structure 221 had a fine structure with the metal (titanium) plate 210 (length×width: 15,000 nm×10,000 nm, thickness: 300 nm, aspect ratio: 50) and the rectangular columns of a metal (titanium) (length×width: 1,000 nm×8,000 nm, height: 100 nm) at both the ends thereof, and 70% or more of the metal (titanium) plate 210 was not collapsed and was not in contact with the silicon oxide layer 201. The pattern collapse was observed with "FE-SEM S-5500 (model number)", produced by Hitachi High-Technologies Corporation. The compositions of the processing liquids 1 to 16 used in the examples are shown in Table 1, and the processing liquids, the processing methods and the results of collapse suppression ratios in the examples are shown in Table 6.

Comparative Example 31

A bridge structure 211 shown in FIG. 2(j) was obtained in the same manner as in Example 49 except that after removing the polysilicon 202 of the structure shown in FIG. 2(i) by dissolving with a tetramethylammonium hydroxide aqueous solution, the structure was processed only with pure water. 50% or more of the resulting bridge structures 211 was collapsed as shown in FIG. 2(k). The processing liquid, the processing method and the result of collapse suppression ratio in Comparative Example 31 are shown in Table 6.

Comparative Examples 32 to 40

Bridge structures 211 shown in FIG. 2(j) of Comparative Examples 32 to 40 were obtained in the same manner as in Example 49 except that after removing the polysilicon 202 of the structure shown in FIG. 2(i) by dissolving with a tetramethylammonium hydroxide aqueous solution and being processed with pure water, the structure was processed with the comparative liquids 1 to 9 shown in Table 2 instead of the processing liquid 1. 50% or more of the resulting bridge structures 211 was collapsed as shown in FIG. 2(k) (which indicated a collapse suppression ratio of less than 50%). The compositions of the comparative liquids 1 to 9 used in Comparative Example 31 are shown in Table 2, and the comparative liquids, the processing methods and the results of collapse suppression ratios in the comparative examples are shown in Table 6.

TABLE 6

| | Processing method | Collapse suppression ratio*[1] | Pass or fail |
|---|---|---|---|
| Example 49 | pure water -> processing liquid 1 -> pure water -> drying | 70% or more | pass |
| Example 50 | pure water -> processing liquid 2 -> pure water -> drying | 90% or more | pass |
| Example 51 | pure water -> processing liquid 3 -> pure water -> drying | 70% or more | pass |
| Example 52 | pure water -> processing liquid 4 -> pure water -> drying | 80% or more | pass |
| Example 53 | pure water -> processing liquid 5 -> pure water -> drying | 80% or more | pass |
| Example 54 | pure water -> processing liquid 6 -> pure water -> drying | 80% or more | pass |
| Example 55 | pure water -> processing liquid 7 -> pure water -> drying | 80% or more | pass |
| Example 56 | pure water -> processing liquid 8 -> pure water -> drying | 80% or more | pass |
| Example 57 | pure water -> processing liquid 9 -> pure water -> drying | 80% or more | pass |
| Example 58 | pure water -> processing liquid 10 -> pure water -> drying | 90% or more | pass |
| Example 59 | pure water -> processing liquid 11 -> pure water -> drying | 90% or more | pass |
| Example 60 | pure water -> processing liquid 12 -> pure water -> drying | 80% or more | pass |
| Example 61 | pure water -> processing liquid 13 -> pure water -> drying | 80% or more | pass |
| Example 62 | pure water -> processing liquid 14 -> pure water -> drying | 70% or more | pass |
| Example 63 | pure water -> processing liquid 15 -> pure water -> drying | 70% or more | pass |
| Example 64 | pure water -> processing liquid 16 -> pure water -> drying | 70% or more | pass |
| Comparative Example 31 | pure water -> drying | less than 50% | fail |
| Comparative Example 32 | pure water -> comparative liquid 1 -> pure water -> drying | less than 50% | fail |
| Comparative Example 33 | pure water -> comparative liquid 2 -> pure water -> drying | less than 50% | fail |
| Comparative Example 34 | pure water -> comparative liquid 3 -> pure water -> drying | less than 50% | fail |
| Comparative Example 35 | pure water -> comparative liquid 4 -> pure water -> drying | less than 50% | fail |
| Comparative Example 36 | pure water -> comparative liquid 5 -> pure water -> drying | less than 50% | fail |
| Comparative Example 37 | pure water -> comparative liquid 6 -> pure water -> drying | less than 50% | fail |
| Comparative Example 38 | pure water -> comparative liquid 7 -> pure water -> drying | less than 50% | fail |
| Comparative Example 39 | pure water -> comparative liquid 8 -> pure water -> drying | less than 50% | fail |
| Comparative Example 40 | pure water -> comparative liquid 9 -> pure water -> drying | less than 50% | fail |

*[1]collapse suppression ratio = ((number of bridge structures not collapsed)/(total number of bridge structures)) × 100 (%)

Examples 65 to 80

Bridge structures 211 shown in FIG. 2(j) of Examples 65 to 80 were obtained in the same manner as in Examples 49 to 64 except that aluminum oxide was used as the metal instead of titanium.

The resulting bridge structures 211 had a fine structure with the metal (aluminum oxide) plate 210 (length×width: 15,000 nm×10,000 nm, thickness: 300 nm, aspect ratio: 50) and the rectangular columns of a metal (aluminum oxide) (length×width: 1,000 nm×8,000 nm, height: 100 nm) at both the ends thereof, and 70% or more of the metal (aluminum oxide) plate 210 was not collapsed and was not in contact with the silicon oxide layer 201. The compositions of the processing liquids 1 to 16 used in the examples are shown in Table 1, and the processing liquids, the processing methods and the results of collapse suppression ratios in the examples are shown in Table 7.

Comparative Examples 41 to 50

Bridge structures 211 shown in FIG. 2(j) of Comparative Examples 41 to 50 were obtained in the same manner as in Comparative Examples 31 to 40 except that aluminum oxide was used as the metal instead of titanium. 50% or more of the resulting bridge structures was collapsed as shown in FIG. 2(k).
The compositions of the comparative liquids 1 to 9 used in the comparative examples are shown in Table 2, and the comparative liquids, the processing methods and the results of collapse suppression ratios in the comparative examples are shown in Table 7.

15,000 nm×10,000 nm, thickness: 300 nm, aspect ratio: 50) and the rectangular columns of a metal (hafnium oxide) (length×width: 1,000 nm×8,000 nm, height: 100 nm) at both the ends thereof, and 70% or more of the metal (hafnium oxide) plate 210 was not collapsed and was not in contact with the silicon oxide layer 201. The compositions of the processing liquids 1 to 16 used in the examples are shown in Table 1, and the processing liquids, the processing methods and the results of collapse suppression ratios in the examples are shown in Table 8.

Comparative Examples 51 to 60

Bridge structures 211 shown in FIG. 2(j) of Comparative Examples 51 to 60 were obtained in the same manner as in

TABLE 7

|  | Processing method | Collapse suppression ratio*1 | Pass or fail |
|---|---|---|---|
| Example 65 | pure water -> processing liquid 1 -> pure water -> drying | 70% or more | pass |
| Example 66 | pure water -> processing liquid 2 -> pure water -> drying | 90% or more | pass |
| Example 67 | pure water -> processing liquid 3 -> pure water -> drying | 70% or more | pass |
| Example 68 | pure water -> processing liquid 4 -> pure water -> drying | 80% or more | pass |
| Example 69 | pure water -> processing liquid 5 -> pure water -> drying | 80% or more | pass |
| Example 70 | pure water -> processing liquid 6 -> pure water -> drying | 80% or more | pass |
| Example 71 | pure water -> processing liquid 7 -> pure water -> drying | 80% or more | pass |
| Example 72 | pure water -> processing liquid 8 -> pure water -> drying | 80% or more | pass |
| Example 73 | pure water -> processing liquid 9 -> pure water -> drying | 80% or more | pass |
| Example 74 | pure water -> processing liquid 10 -> pure water -> drying | 90% or more | pass |
| Example 75 | pure water -> processing liquid 11 -> pure water -> drying | 90% or more | pass |
| Example 76 | pure water -> processing liquid 12 -> pure water -> drying | 80% or more | pass |
| Example 77 | pure water -> processing liquid 13 -> pure water -> drying | 80% or more | pass |
| Example 78 | pure water -> processing liquid 14 -> pure water -> drying | 70% or more | pass |
| Example 79 | pure water -> processing liquid 15 -> pure water -> drying | 70% or more | pass |
| Example 80 | pure water -> processing liquid 16 -> pure water -> drying | 70% or more | pass |
| Comparative Example 41 | pure water -> drying | less than 50% | fail |
| Comparative Example 42 | pure water -> comparative liquid 1 -> pure water -> drying | less than 50% | fail |
| Comparative Example 43 | pure water -> comparative liquid 2 -> pure water -> drying | less than 50% | fail |
| Comparative Example 44 | pure water -> comparative liquid 3 -> pure water -> drying | less than 50% | fail |
| Comparative Example 45 | pure water -> comparative liquid 4 -> pure water -> drying | less than 50% | fail |
| Comparative Example 46 | pure water -> comparative liquid 5 -> pure water -> drying | less than 50% | fail |
| Comparative Example 47 | pure water -> comparative liquid 6 -> pure water -> drying | less than 50% | fail |
| Comparative Example 48 | pure water -> comparative liquid 7 -> pure water -> drying | less than 50% | fail |
| Comparative Example 49 | pure water -> comparative liquid 8 -> pure water -> drying | less than 50% | fail |
| Comparative Example 50 | pure water -> comparative liquid 9 -> pure water -> drying | less than 50% | fail |

*1 collapse suppression ratio = ((number of bridge structures not collapsed)/(total number of bridge structures)) × 100 (%)

Examples 81 to 96

Bridge structures 211 shown in FIG. 2(j) of Examples 81 to 96 were obtained in the same manner as in Examples 49 to 64 except that hafnium oxide was used as the metal instead of titanium.
The resulting bridge structures 211 had a fine structure with the metal (hafnium oxide) plate 210 (length×width:

Comparative Examples 31 to 40 except that hafnium oxide was used as the metal instead of titanium. 50% or more of the resulting bridge structures was collapsed as shown in FIG. 2(k). The compositions of the comparative liquids 1 to 9 used in the comparative examples are shown in Table 2, and the comparative liquids, the processing methods and the results of collapse suppression ratios in the comparative examples are shown in Table 8.

TABLE 8

|  | Processing method | Collapse suppression ratio*1 | Pass or fail |
|---|---|---|---|
| Example 81 | pure water -> processing liquid 1 -> pure water -> drying | 70% or more | pass |
| Example 82 | pure water -> processing liquid 2 -> pure water -> drying | 90% or more | pass |
| Example 83 | pure water -> processing liquid 3 -> pure water -> drying | 70% or more | pass |
| Example 84 | pure water -> processing liquid 4 -> pure water -> drying | 80% or more | pass |
| Example 85 | pure water -> processing liquid 5 -> pure water -> drying | 80% or more | pass |
| Example 86 | pure water -> processing liquid 6 -> pure water -> drying | 80% or more | pass |
| Example 87 | pure water -> processing liquid 7 -> pure water -> drying | 80% or more | pass |
| Example 88 | pure water -> processing liquid 8 -> pure water -> drying | 80% or more | pass |
| Example 89 | pure water -> processing liquid 9 -> pure water -> drying | 80% or more | pass |

TABLE 8-continued

|  | Processing method | Collapse suppression ratio*[1] | Pass or fail |
|---|---|---|---|
| Example 90 | pure water -> processing liquid 10 -> pure water -> drying | 90% or more | pass |
| Example 91 | pure water -> processing liquid 11 -> pure water -> drying | 90% or more | pass |
| Example 92 | pure water -> processing liquid 12 -> pure water -> drying | 80% or more | pass |
| Example 93 | pure water -> processing liquid 13 -> pure water -> drying | 80% or more | pass |
| Example 94 | pure water -> processing liquid 14 -> pure water -> drying | 70% or more | pass |
| Example 95 | pure water -> processing liquid 15 -> pure water -> drying | 70% or more | pass |
| Example 96 | pure water -> processing liquid 16 -> pure water -> drying | 70% or more | pass |
| Comparative Example 51 | pure water -> drying | less than 50% | fail |
| Comparative Example 52 | pure water -> comparative liquid 1 -> pure water -> drying | less than 50% | fail |
| Comparative Example 53 | pure water -> comparative liquid 2 -> pure water -> drying | less than 50% | fail |
| Comparative Example 54 | pure water -> comparative liquid 3 -> pure water -> drying | less than 50% | fail |
| Comparative Example 55 | pure water -> comparative liquid 4 -> pure water -> drying | less than 50% | fail |
| Comparative Example 56 | pure water -> comparative liquid 5 -> pure water -> drying | less than 50% | fail |
| Comparative Example 57 | pure water -> comparative liquid 6 -> pure water -> drying | less than 50% | fail |
| Comparative Example 58 | pure water -> comparative liquid 7 -> pure water -> drying | less than 50% | fail |
| Comparative Example 59 | pure water -> comparative liquid 8 -> pure water -> drying | less than 50% | fail |
| Comparative Example 60 | pure water -> comparative liquid 9 -> pure water -> drying | less than 50% | fail |

*[1]collapse suppression ratio = ((number of bridge structures not collapsed)/(total number of bridge structures)) × 100 (%)

Examples 97 to 112

Bridge structures 211 shown in FIG. 2(j) of Examples 97 to 112 were obtained in the same manner as in Examples 49 to 64 except that ruthenium was used as the metal instead of titanium.

The resulting bridge structures 211 had a fine structure with the metal (ruthenium) plate 210 (length×width: 15,000 nm×10,000 nm, thickness: 300 nm, aspect ratio: 50) and the rectangular columns of a metal (ruthenium) (length×width: 1,000 nm×8,000 nm, height: 100 nm) at both the ends thereof, and 70% or more of the metal (ruthenium) plate 210 was not collapsed and was not in contact with the silicon oxide layer 201. The pattern collapse was observed with "FE-SEM S-5500 (model number)", produced by Hitachi High-Technologies Corporation. The compositions of the processing liquids 1 to 16 used in the examples are shown in Table 1, and the processing liquids, the processing methods and the results of collapse suppression ratios in the examples are shown in Table 9.

Comparative Examples 61 to 70

Bridge structures 211 shown in FIG. 2(j) of Comparative Examples 61 to 70 were obtained in the same manner as in Comparative Examples 31 to 40 except that ruthenium was used as the metal instead of titanium. 50% or more of the resulting bridge structures was collapsed as shown in FIG. 2(k). The compositions of the comparative liquids 1 to 9 used in the comparative examples are shown in Table 2, and the comparative liquids, the processing methods and the results of collapse suppression ratios in the comparative examples are shown in Table 9.

TABLE 9

|  | Processing method | Collapse suppression ratio*[1] | Pass or fail |
|---|---|---|---|
| Example 97 | pure water -> processing liquid 1 -> pure water -> drying | 70% or more | pass |
| Example 98 | pure water -> processing liquid 2 -> pure water -> drying | 90% or more | pass |
| Example 99 | pure water -> processing liquid 3 -> pure water -> drying | 70% or more | pass |
| Example 100 | pure water -> processing liquid 4 -> pure water -> drying | 80% or more | pass |
| Example 101 | pure water -> processing liquid 5 -> pure water -> drying | 80% or more | pass |
| Example 102 | pure water -> processing liquid 6 -> pure water -> drying | 80% or more | pass |
| Example 103 | pure water -> processing liquid 7 -> pure water -> drying | 80% or more | pass |
| Example 104 | pure water -> processing liquid 8 -> pure water -> drying | 80% or more | pass |
| Example 105 | pure water -> processing liquid 9 -> pure water -> drying | 80% or more | pass |
| Example 106 | pure water -> processing liquid 10 -> pure water -> drying | 90% or more | pass |
| Example 107 | pure water -> processing liquid 11 -> pure water -> drying | 90% or more | pass |
| Example 108 | pure water -> processing liquid 12 -> pure water -> drying | 80% or more | pass |
| Example 109 | pure water -> processing liquid 13 -> pure water -> drying | 80% or more | pass |
| Example 110 | pure water -> processing liquid 14 -> pure water -> drying | 70% or more | pass |
| Example 111 | pure water -> processing liquid 15 -> pure water -> drying | 70% or more | pass |
| Example 112 | pure water -> processing liquid 16 -> pure water -> drying | 70% or more | pass |
| Comparative Example 61 | pure water -> drying | less than 50% | fail |
| Comparative Example 62 | pure water -> comparative liquid 1 -> pure water -> drying | less than 50% | fail |
| Comparative Example 63 | pure water -> comparative liquid 2 -> pure water -> drying | less than 50% | fail |
| Comparative Example 64 | pure water -> comparative liquid 3 -> pure water -> drying | less than 50% | fail |
| Comparative Example 65 | pure water -> comparative liquid 4 -> pure water -> drying | less than 50% | fail |
| Comparative Example 66 | pure water -> comparative liquid 5 -> pure water -> drying | less than 50% | fail |
| Comparative Example 67 | pure water -> comparative liquid 6 -> pure water -> drying | less than 50% | fail |
| Comparative Example 68 | pure water -> comparative liquid 7 -> pure water -> drying | less than 50% | fail |
| Comparative Example 69 | pure water -> comparative liquid 8 -> pure water -> drying | less than 50% | fail |
| Comparative Example 70 | pure water -> comparative liquid 9 -> pure water -> drying | less than 50% | fail |

*[1]collapse suppression ratio = ((number of bridge structures not collapsed)/(total number of bridge structures)) × 100 (%)

Industrial Applicability

The processing liquid of the present invention may be used favorably for suppressing pattern collapse in the production of a fine metal structure, such as a semiconductor device and a micromachine (MEMS).

The invention claimed is:

1. A processing liquid for suppressing pattern collapse of a fine metal structure, consisting essentially of at least one ester represented by formula (1) or formula (2):

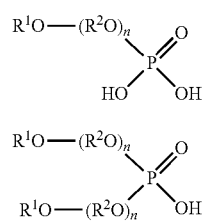

wherein
$R^1$ represents an alkyl group having 2 to 24 carbon atoms or an alkenyl group having 2 to 24 carbon atoms; and
$R^2$ represents an alkanediyl group or an alkenediyl group having 2 to 6 carbon atoms, in which plural groups represented by $R^1$ or $R^2$ may be the same as or different from each other; and
n is 0, and
wherein a content of the at least one ester is 10 ppm to 1000 ppm by mass, based on a mass of the processing liquid.

2. The processing liquid according to claim 1, further comprising water.

3. The processing liquid according to claim 1, wherein the liquid is suitable for suppressing pattern collapse of a fine metal structure comprising at least one material selected from the group consisting of titanium nitride, titanium, ruthenium, ruthenium oxide, tungsten, tungsten silicide, tungsten nitride, aluminum oxide, hafnium oxide, hafnium silicate, hafnium nitride silicate, platinum, tantalum, tantalum oxide, tantalum nitride, nickel silicide, nickel silicon germanium and nickel germanium.

4. The processing liquid of claim 1, wherein $R^1$ represents an alkyl group having 6 to 18 carbon atoms.

5. The processing liquid of claim 1, wherein $R^1$ represents an alkyl group having 12, 13, or 18 carbon atoms.

6. The processing liquid of claim 1, wherein $R^1$ represents an alkenyl group having 6 to 18 carbon atoms.

7. The processing liquid of claim 1, wherein $R^1$ is an oleyl group having 18 carbon atoms.

8. The processing liquid of claim 1, which consists of the ester represented by formula (1) or formula (2) and water.

9. The processing liquid of claim 1, wherein the ester is at least one selected from the group consisting of an octyl phosphate ester and a lauryl phosphate ester.

10. A method for producing a fine metal structure, comprising a wet etching or a dry etching, followed by a rinsing in the presence of the processing liquid according to claim 1, to obtain a fine metal structure.

11. The method according to claim 10, wherein the fine metal structure comprises at least one material selected from the group consisting of titanium nitride, titanium, ruthenium, ruthenium oxide, tungsten, tungsten silicide, tungsten nitride, aluminum oxide, hafnium oxide, hafnium silicate, hafnium nitride silicate, platinum, tantalum, tantalum oxide, tantalum nitride, nickel silicide, nickel silicon germanium and nickel germanium.

12. The method according to claim 10, wherein the fine metal structure is a semiconductor device or a micromachine.

13. A method of suppressing pattern collapse of a fine metal structure, the method comprising:
wet etching or dry etching a material comprising a fine metal structure,
contacting the material with the processing liquid of claim 1,
rinsing the material with water, and
drying the material,
to obtain a fine metal structure having suppressed pattern collapse.

14. The method of claim 13, wherein the contacting comprises dipping, and the dipping is performed for a time of 30 seconds to 10 minutes, at a temperature of 25 to 40° C.

15. The method of claim 13, wherein the material comprising a fine metal structure is a semiconductor device.

16. The method of claim 13, wherein the material comprising a fine metal structure is a micromachine.

* * * * *